A. L. ROBINSON

SEMICONDUCTOR CIRCUIT ELEMENT

Filed April 26, 1952

INVENTOR
A. L. ROBINSON
BY
ATTORNEY

Patented Jan. 26, 1954

2,667,607

UNITED STATES PATENT OFFICE 2,667,607

SEMICONDUCTOR CIRCUIT ELEMENT

Albert L. Robinson, Short Hills, N. J., assignor to Bell Telephone Laboratories, Incorporated, New York, N. Y., a corporation of New York Application April 26, 1952, Serial No. 284,628

10 Claims. (Cl. 317—234)

This invention relates to circuit elements and more particularly to such elements of the general type disclosed in the application Serial No. 284,567, filed April 26, 1952, of Everett T. Burton.

As disclosed in the above-identified application, a circuit element comprising a plurality of junction diodes electrically associated in accordance with a prescribed circuit pattern may be fabricated expeditiously as a compact unitary structure involving but little wiring, by slotting a semiconductive body, for example of germanium or silicon, of NPN or PNP configuration. In one illustrative embodiment, the element, particularly suitable for line finding in telephone switching systems, comprises a plurality of groups of diodes with those of each group associated in common back to back relation with another diode. Such element may be fabricated by providing a semiconductive body comprising a zone of one conductivity type between and forming rectifying junctions with a pair of zones of the opposite conductivity type, with a plurality of slots each of which extends through one of the outer zones and across the junction associated therewith and certain of which extend also through the intermediate zone and across the other junction.

One general object of this invention is to enable the ready fabrication of multi-diode semiconductor circuit elements of novel circuital association.

More specifically, one object of this invention is to simplify, and to facilitate the construction of, circuit elements including a plurality of diodes at least certain of which are in series relation.

In accordance with one feature of this invention, a circuit element is constituted by a block of semiconductive material, such as germanium or silicon, of NPN or PNP configuration and provided with slots extending from opposite ends of the block, each of the slots extending through a corresponding pair of junction defining zones and at least some of the slots extending across both of the junctions. The slots are disposed so that the block is divided into a plurality of junction diodes in prescribed electrical relation, certain of the diodes being in series relation. One or more of the diodes may be short circuited, as by conductivity bridging the junctions thereof, to determine the circuited pattern of the related units.

In one illustrative embodiment, the slots are arranged to divide the semiconductive body into a plurality of diodes in series relation and alternate units are short circuited thereby to provide a circuit element composed of a series of diodes which may be utilized individually or in a variety of combinations.

In another illustrative embodiment, the slots are arranged and appropriate junctions are short circuited to provide a multi-diode unit especially advantageous for use in a two stage multi-termina advantageous for use in a two stage multi-terminal switch.

The invention and the above noted and other features thereof will be understood more clearly and fully from the following detailed description with reference to the accompanying drawing wherein each figure except Fig. 1 is composed of two parts, part A illustrating a semiconductive circuit element constructed in accordance with this invention and part B depicting the circuit analog of this element. In the drawing:

Figure 1:
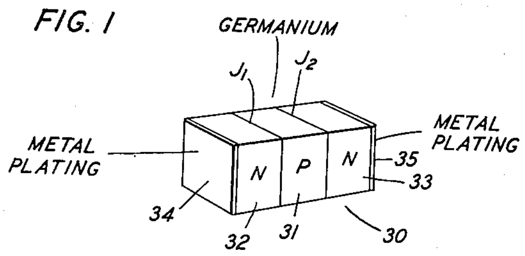
Fig. 1 is a perspective view of a semiconductive body illustrative of those which may be utilized in the fabrication of circuit elements constructed in accordance with this invention.

In the drawing, zones of the semiconductive bodies shown are designated by the letter, N or P, indicative of the conductivity type thereof. For the sake of clarity and simplicity of illustration, in part A of each of Figs. 2 and 3, in which the semiconductive body comprises a multiplicity of N and P portions, the division of the body into zones of which these portions are constituted, is indicated by section lines and a single letter, N or P, has been employed to indicate the conductivity type of all portions between or to one side of the section lines.

Referring now to the drawing, Fig. 1 illustrates a semiconductive body 30, for example of germanium or silicon and advantageously of single crystal structure, which may be utilized in the fabrication of circuit elements in accordance with this invention. The body comprises a P conductivity type zone 31 between a pair of N zones 32 and 33, advantageously of the same conductivity, and forming rectifying junctions $J_1$ and $J_2$ therewith. The outer end faces of the zones 32 and 33 have thereon metal, e. g. copper or rhodium, platings 34 and 35 providing ohmic connections to the N zones 32 and 33 respectively. As will appear hereinafter, similar platings may be applied on one or more faces of the P zone 31 to provide ohmic connections thereto.

Each N zone defines a rectifier unit or element with the P zone 31, the rectifying barrier obtaining at the junction $J_1$ or $J_2$. The characteristics of the junctions are substantially uniform over their areas. Thus, elemental areas of each junction will provide substantially the same rectification performance.

Semiconductor bodies of the configuration depicted in Fig. 1 may be fabricated, for example in the manner disclosed in the application Serial No. 168,184, filed June 15, 1950 of G. K. Teal.

Figure 2A:
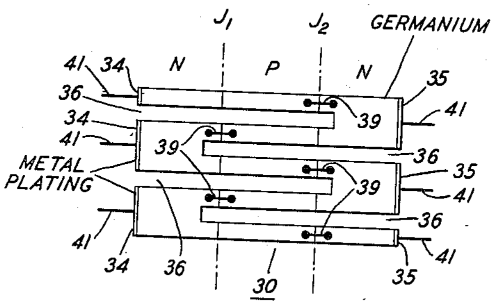
Fig. 2 shows one embodiment of this invention constituting a circuit element comprising a plurality of junction diodes in series.
Figure 2B:
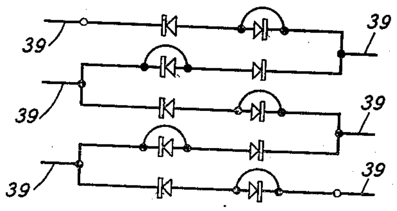

In the embodiment of this invention illustrated in Fig. 2A, the semiconductive body 30 has therein a plurality of slots 36, each of which extends across both the junctions $J_1$ and $J_2$ whereby there are provided rectifiers or diodes arranged and connected as depicted in Fig. 2B. Alternate diodes may be short circuited by conductors 39, which may be short lengths of wire soldered to the semiconductive body, or metal coatings or platings applied over the junction portions defining these diodes.

The slots may be produced by saw cutting a semiconductive body of the construction shown in Fig. 1. Advantageously, in order to prevent degradation of the junction characteristics as a result of the sawing, the body is etched and rinsed after the cutting of the slots. Suitable leading in conductors 41 may be affixed, as by soldering, to the platings or coatings 34 and 35.

As is manifest from Fig. 2B, the circuit element portrayed in Fig. 2A constitutes a plurality, five, of diodes serially connected, any one of which may be used independently or any two or more of which may be employed in series. Thus, this element provides a compact unit capable of a variety of circuit applications. It will be understood, of course, that although in the body depicted in Fig. 2A, four slots are provided, a greater number may be employed with corresponding increase in the number of diodes obtained.

Figure 3A:
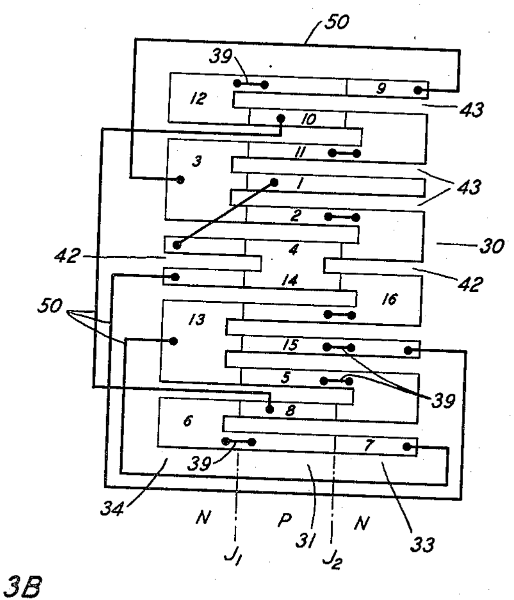
Fig. 3 depicts another embodiment of this invention wherein the diodes are associated to define a two-stage switch.

In the embodiment of the invention illustrated in Fig. 3, the circuit element comprises a plurality of NP diodes associated to constitute a two-stage switch. Specifically, as shown in Fig. 3A, the semiconductive body 30, of NPN configuration as indicated, is provided with a pair of slots 42 each of which extends through a respective one of the N zones 33 or 34 and across the junction, $J_1$ or $J_2$ associated with that zone. The body is provided also with a plurality of slots 43 each of which extends through the P zone 31 and one of the N zones and across both the junctions $J_1$ and $J_2$. Certain of the diodes thus produced are shorted by conductors or coatings 39. Thus the body comprises sixteen diodes one terminal of which is indicated by the respective numeral, 1 to 16 in Fig. 3A. Certain of these terminals are connected together by the wires 50 as indicated.

Figure 3B:
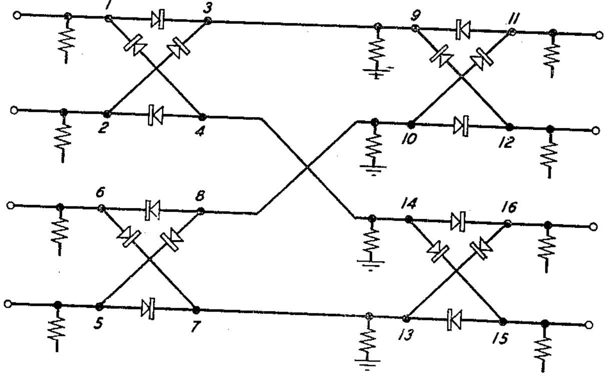

The circuit configuration of the circuit element of Fig. 3A is represented in Fig. 3B in which the terminals corresponding to those in the device of Fig. 3A are designated by the corresponding numbers. It will be seen that this element constitutes a two-stage switch. The operation will be understood from consideration of typical cases. For example, if terminals 1 and 11 are made positive a path is closed over terminals 1, 3, 9 and 11. If both terminals 1 and 16 are made negative, a path is closed over terminals 1, 4, 14 and 16. A path may be closed from terminal 1 to terminal 15 over 4 and 14 by making 1 and 15 negative, or from terminal 1 to 12 by making 1 and 12 positive. In similar manner, paths may be completed or closed from each of terminals 2, 5 and 6 to any one of the terminals 11, 12, 15 or 16.

What is claimed is:

1. A circuit element comprising a body of semiconductive material having therein a pair of outer zones of one conductivity type on opposite sides of and forming PN junctions with an intermediate zone of the opposite conductivity type, said body having therein a series of slots certain of which extend through one of said pair of zones and across both of the junctions and others of which extend through the other of said pair of zones and across both of said junctions.

2. A circuit element in accordance with claim 1 comprising means short circuiting certain of the junction segments formed by said slots.

3. A circuit element in accordance with claim 1 comprising means electrically connecting certain non-adjacent segments of said zones formed by said slots.

4. A circuit element comprising a body of semiconductive material including a zone of one conductivity type between and defining a pair of PN junctions with a pair of zones of the other conductivity type, said body having therein slots each extending through said first zone and across both said junctions, at least one of said slots extending through one of said pair of zones and at least one other slot extending through the other of said pair of zones, and individual electrical connections to the resulting elements of said pair of zones.

5. A circuit element comprising a body of semiconductive material having therein a pair of zones of one conductivity type on opposite sides of and defining a pair of rectifying junctions with a third zone, said body having therein a plurality of slots each extending through one of said pair of zones and across both of said junctions, said slots being arranged to divide said body into a series of pairs of diodes in back to back relation, and means short circuiting alternate diodes in said series.

6. A circuit element comprising a body of semiconductive material having therein a pair of zones of one conductivity type on opposite sides of and defining a pair of rectifying junctions with a third zone, said body having therein a plurality of slots each extending through one of said pair of zones and across both said junctions and having therein a second group of parallel slots in alternate relation with those of the first group and each extending through the other of said pair of zones and across both of said junctions, whereby said body is divided into a series of diodes adjacent ones of which are in back to back relation.

7. A circuit element in accordance with claim 6 comprising means short circuiting alternate diodes in said series.

8. A circuit element comprising a body of semiconductive material having therein a first zone of one conductivity type and a pair of zones of the opposite conductivity type on opposite sides of and defining a pair of junctions with said first zone, said body having therein a plurality of slots dividing said body into a plurality of diodes arranged in accordance with a prescribed circuit pattern, certain of said slots extending each through one of said pair of zones and across only one of said junctions and other of said slots each extending through one of said pair of zones and said first zone and across both of said junctions.

9. A circuit element in accordance with claim 8 comprising means interconnecting said diodes in the pattern of a four pole two stage switch, said means comprising means shorting certain of said diodes and conductors connecting certain of said diodes.

10. A circuit element comprising a body of semiconductive material including a pair of outer zones of one conductivity type on opposite sides of and defining a pair of junctions with an intermediate zone of the opposite conductivity type, said body having therein a pair of opposed slots each extending through a respective one of said outer zones and across the junction corresponding thereto, said body having therein also a plurality of slots on opposite sides of one of said first slots and each extending through one of said outer zones and said intermediate zone, and said body having therein further a plurality of slots on opposite sides of the other of said first slots and each extending through the other of said outer zones and said intermediate zone.

ALBERT L. ROBINSON.

References Cited in the file of this patent

UNITED STATES PATENTS

| Number | Name | Date |
|---|---|---|
| 2,402,661 | Ohl | June 25, 1946 |
| 2,595,497 | Webster | May 6, 1952 |
| 2,623,102 | Shockley | Dec. 23, 1952 |